US 6,617,561 B1

(12) United States Patent
Wei et al.

(10) Patent No.: US 6,617,561 B1
(45) Date of Patent: Sep. 9, 2003

(54) LOW NOISE AND HIGH YIELD DATA LINE STRUCTURE FOR IMAGER

(75) Inventors: Ching-Yeu Wei, Schenecctady, NY (US); Jianqiang Liu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/522,355

(22) Filed: Mar. 9, 2000

(51) Int. Cl.[7] .............................................. H01L 27/00
(52) U.S. Cl. ............................ 250/208.1; 250/214 R; 257/290; 348/294
(58) Field of Search ...................... 250/208.1, 214 R; 348/294, 302, 308; 257/290, 291

(56) References Cited

U.S. PATENT DOCUMENTS

| 5,313,319 A | | 5/1994 | Salisbury ..................... 359/60 |
| 5,435,608 A | * | 7/1995 | Wei et al. ..................... 257/292 |
| 5,480,810 A | | 1/1996 | Wei et al. ..................... 437/2 |
| 5,563,426 A | | 10/1996 | Zhang et al. ................. 257/66 |
| 5,616,524 A | | 4/1997 | Wei et al. ..................... 438/4 |
| 5,834,321 A | * | 11/1998 | Salisbury ..................... 257/59 |
| 5,859,463 A | * | 1/1999 | Liu et al. ..................... 257/234 |
| 6,037,609 A | * | 3/2000 | Liu et al. ..................... 257/59 |
| 6,167,110 A | * | 12/2000 | Possin et al. ................. 378/19 |
| 6,465,824 B1 | * | 10/2002 | Kwasnick et al. .......... 257/290 |

FOREIGN PATENT DOCUMENTS

| EP | 814515 A2 | 6/1997 |
| EP | 814606 A2 | 6/1997 |

OTHER PUBLICATIONS

Becks et al., "A Multichip Module, the Basic Building Block for Large Area Pixel Detectors," (1996) IEEE.*

* cited by examiner

Primary Examiner—David V. Bruce
Assistant Examiner—Courtney Thomas
(74) Attorney, Agent, or Firm—Paul J. DiConza; Patrick K. Patnode

(57) ABSTRACT

An imager includes a photodiode array, each photodiode having an associated switching device, such as a thin-film transistor, addressable via a scan line. A data line for reading out from the photodiodes is formed first on a glass substrate, allowing the data line to be optimized in terms of thickness for conductivity.

16 Claims, 6 Drawing Sheets

LOW NOISE AND HIGH YIELD DATA LINE STRUCTURE FOR IMAGER

BACKGROUND

The present invention generally relates to light imaging arrays. More particularly, the present invention relates to light imaging arrays with data lines formed directly on the substrate.

Light-sensitive arrays for converting incident radiant energy into an electrical signal are commonly used in imaging applications, for example, x-ray imagers and facsimile device arrays. Hydrogenated amorphous silicon (a-Si) and alloys of a-Si are commonly used in the fabrication of photosensitive elements due to the advantageous characteristics of a-Si and the relative ease of fabrication. In particular, light-sensitive devices, such as photodiodes, can be formed in conjunction with necessary control or switching elements, such as thin-film transistors (TFTs), in relatively large arrays. As one skilled in the art will know, a thin-film transistor is comprised of thin layers on glass, where the glass acts only as a support, rather than doping of a silicon substrate.

X-ray imagers, for example, are formed on a substantially flat substrate, typically glass. The imager comprises an array of pixels with light-sensitive imaging devices, typically photodiodes, each of which has an associated switching element, such as TFTs. The array is addressed around its perimeter by a plurality of row and column scan lines having contact pads extending along the array. In operation, the voltage on the row lines, and hence the TFTs, are switched on in turn, allowing the charge on that scanned line's photodiodes to be read out via the column scan lines, which typically include amplifiers. The row address lines are commonly referred to as "scan lines" or "address lines" and the column address lines are referred to as "data lines" or "read-out lines."

Presently, the address lines are formed first on a bare substrate, typically glass, and the data lines are formed subsequently during the same process steps as the source and drain of the TFT switching element. As one skilled in the art will know, defects are more prevalent on later fabrication steps. Since the data line carries the image information, it is important for image quality that the data line be as reliable as possible. For this and other reasons, it would be helpful if the data line could be formed earlier in the fabrication process.

SUMMARY OF INVENTION

The present invention provides, in a first aspect, an exemplary imaging apparatus. The imaging apparatus includes a substrate, at least one light-sensitive imaging device disposed over the substrate, and a data line directly on the substrate coupled to the at least one light-sensitive imaging device.

The present invention provides, in a second aspect, an exemplary imager. The imager includes a substrate, an array of photodiodes vertically adjacent the substrate, at least one data line directly on the substrate, a plurality of switching devices coupled between the at least one data line and the array of photodiodes, and at least one addressing line coupled to the switching devices.

The present invention provides, in a third aspect, an exemplary method of forming an imaging apparatus. The method includes providing a substrate, forming a data line directly on the substrate, forming at least one light-sensitive imaging device vertically adjacent the substrate, and coupling the data line to the light-sensitive imaging device.

The present invention provides, in a fourth aspect, an exemplary method of forming an imager. The method includes providing a substrate, forming at least one data line directly on the substrate, forming an array of photodiodes vertically adjacent the substrate, forming a plurality of switching devices coupled between the data line and the array of photodiodes, forming at least one addressing line vertically adjacent substrate, and coupling the addressing line to the switching devices.

DETAILED DESCRIPTION OF THE INVENTION

Figure 1:
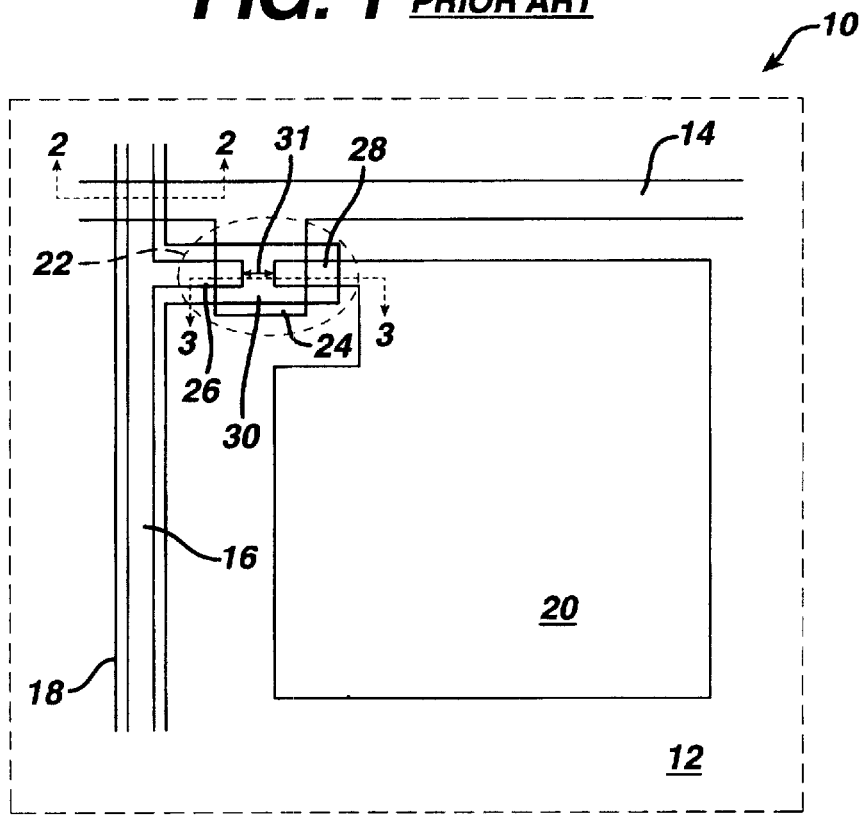
FIG. 1 is a plan view of a portion of a prior art imaging array.

FIG. 1 is a plan view of a portion 10 of a prior art imaging array, prior to deposition of a common electrode over the array. As one skilled in the art will know and generally set forth in U.S. Pat. No. 5,480,810, issued to Wei et al. on Jan. 2, 1996, such an imaging array typically comprises a plurality of photosensor pixels, comprising photodiodes or the like, which are sensitive to incident photons. Each pixel is respectively addressed by a matrix of addressing lines coupled to the pixels; comprising scan lines that are coupled to switching devices to access respective pixels, and data lines that conduct charge collected on the photodiode to readout circuitry. The scan and data lines are electrically insulated from one another by dielectric material disposed between them.

The imaging array portion includes substrate 12 (indicated by dashed lines), typically glass, scan line 14, data line 16 over an insulation layer 18, and a bottom electrode 20 over which a photodiode would be formed (not shown). An amorphous silicon thin-film transistor 22 includes gate 24 that is connected to scan line 14, source 26 that is connected to data line 16, and drain 28 that is connected to bottom electrode 20. Typically, the source and drain are separated by a gap 31 of between about 1 micron and about 5 microns. Better performance is achieved with a shorter gap, however, the gap cannot be so close as to cause an electrical short between the source and drain. An "island" 30 that is connected to layer 18 separates gate 24 and source/drain pair 26/28.

Figure 2:
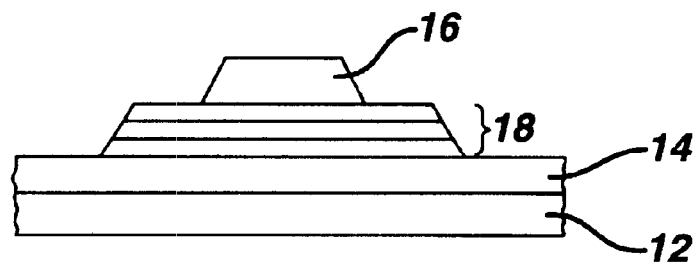
FIGS. 2 and 3 are cross-sectional views of parts of the FIG. 1 portion.
Figure 3:
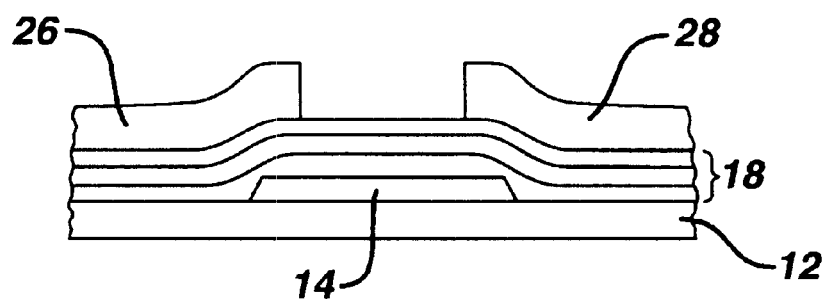

FIGS. 2 and 3 are cross-sectional views of portion 10, taken along lines 2—2 and 3—3 of FIG. 1. In order of fabrication, scan line 14 and connected gate 24 are formed first directly on substrate 12. Scan line 14 and connected gate 24 are made of a conductive material, preferably a metal, for example, molybdenum, chromium, or titanium. Next, layer 18 with connected island 30 is formed. Layer 18 actually comprises three layers: a bottom layer of $Si_3N_4$ having a thickness of about 2500 Å; a middle layer of substantially intrinsic amorphous silicon having a thickness of about 2000 Å; and a top layer in the TFT region of N+ amorphous silicon having a thickness of about 500 Å. Layer 18, provides a semiconductor coupling layer, controlled by the gate, between the source and drain, and also provides as electrical separation between scan line 14 and subsequently formed data line 16. Of the elements shown in FIG. 1, the last to be formed are the data line 16 (with connected source 26) and photodiode bottom electrode 20 (with connected drain 28) in the same metal deposition and patterning steps. Both the data line and bottom electrode are comprised of a metal, such as, for example, molybdenum, titanium, aluminum, chromium or the like. A passivation layer (not shown) covers the source 26, drain 28 and data line 16. Due to this structure, the data line thickness is limited to about 5000 Å. A passivation layer (not shown) is typically deposited over the array after FET formation, comprising an inorganic dielectric material, such as silicon oxide or the like with a thickness of between 0.2 microns and 1 micron. Additional fabrication steps include the formation of the photodiodes, including the deposition and patterning of semiconductive material, typically silicon, to form the photodiode body. A photosensor barrier layer may then be formed over the array, typically comprising a first protective layer comprising an inorganic dielectric material such as silicon nitride or the like. The first protective layer of silicon nitride typically has a thickness in the range between about 0.04 microns and 0.5 microns. A second protective layer comprising an organic dielectric material such as polyimide or the like is disposed over first protective layer and FET passivation layer. The second protective layer typically has a thickness in the range between about 0.5 microns and 2.5 microns. After formation of the photosensor barrier layer, fabrication of the photosensor array is continued with the deposition and patterning of a common electrode disposed over the barrier layer and in electrical contact with a portion of each photosensor body through vias opened in the barrier layer. A scintillator material is then deposited over the common electrode to complete the array. Conventional semiconductor processing techniques are used to build the imaging array, including portion 10.

Imagers based on amorphous silicon TFTs (and more generally, Field Effect transistors or FETs) and photodiodes require a robust data line with zero open line tolerance for image quality, and low line resistance for low noise performance. The structure of portion 10, with the scan line directly on the substrate, limits the choice of data line thickness, and therefore line resistance, due to conflicting requirements for the FET channel length and undercut from the etching process. Where data line patterning is essentially limited to a wet etch, and in the case where molybdenum is employed as the data line material, an unavoidable vertical sidewall profile is produced. The etch of the data line is preferably highly chemically selective from the FET island material. The need for this selectivity is due to the importance of keeping the FET island intact to preserve the initial thickness uniformity in subsequent etching. In order to minimize the variation in the FET island material removed during the back channel etch, it is preferred to start with a relatively uniform FET island thickness and to keep the back channel etch rate as uniform as possible. Since the capacitance of the data line is more or less constant, it is the resistance that must be as small as possible to maximize conductivity and thus minimize data line noise. There are two basic ways to increase conductivity: use an inherently highly conductive material, such as gold, copper or silver; or thicken the data line. However, highly conductive metals such as those mentioned tend to be more difficult to etch and/or may degrade a-Si they come into contact with (use of "and/or" is meant to include both the conjunctive and the disjunctive case). In addition, merely increasing the thickness of the data line makes it difficult to maintain the gap between the source and drain, requires longer etching time, and leads to undercutting of the source and drain contacts. Another conflict is between the FET protection, i.e., the thickness of the passivation layer, and the photodiode leakage performance, where a high step profile can cause photodiode perimeter leakage. Another concern in arrays is an open circuit on the data line, due to the data line suffering small breaks, especially in the region of scan line to data line crossover steps. As a result, it is difficult to optimize fabrication to satisfy both the high performance requirements of the imager, and to prevent open data lines at high processing yields.

The present invention addresses the above-noted problems by providing a structure in which, instead of the scan line, the data line is disposed directly on the substrate. As used herein, "disposed directly on" and the like refers to the material (e.g. data line metal) being disposed in intimate contact, with no intervening material layers, with the underlying structure (e.g., substrate); "disposed over" and the like refer to a component positioned above (as shown in the figures) another component, possibly with intervening layers of other materials. This structure reduces defects in the data line, and allows the data line to be made thicker for improved conductivity and lower noise.

Figure 4:
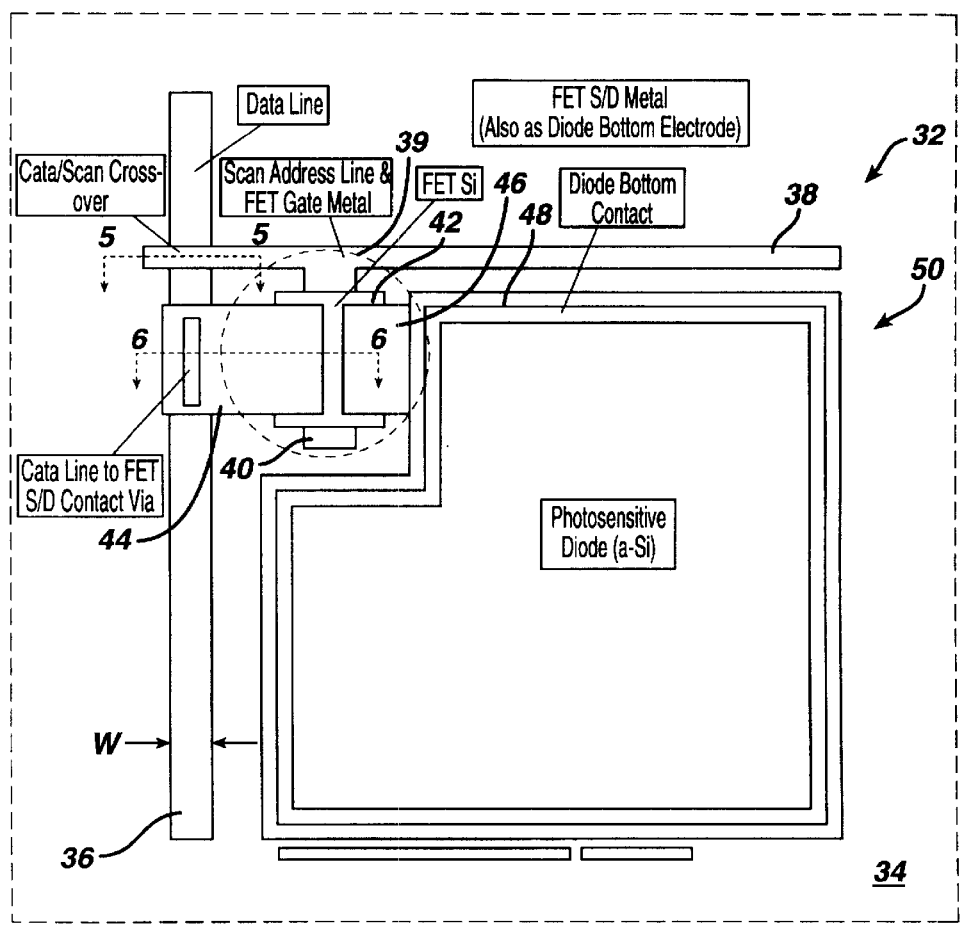
FIG. 4 is a plan view of a portion, i.e., pixel, of an exemplary imaging array in accordance with the present invention.

FIG. 4 is a plan view of a portion 32 of an exemplary silicon-based imaging array in accordance with the present invention. Portion 32 includes substrate 34 (indicated by dashed lines), typically glass, data line 36 for data out, scan line 38 to switch on switching device 39 (in this example, a thin-film transistor), gate 40 attached to scan line 38, island 42 for separating the elements of switching device 39, source 44, drain 46 and connected bottom electrode 48 for light-sensitive imaging device 50 (in this example, a photodiode). In addition, there is a dielectric layer 56 (see FIG. 5) between the scan and data lines.

Data line 36 is formed first directly on substrate 34 and comprises a conductive material, such as, for example, a metal. Substrate 34 is preferably as flat as possible for a more consistent data line with a minimum of dips and bumps. Examples of metals typically used for data line 36 include molybdenum, chromium, aluminum, silver, copper, gold and titanium. This structure allows for a much thicker data line compared to the FIG. 1 structure, with a thickness range of between about 0.2 microns and about 1 micron, or even thicker where required. Thickness refers to the dimension denoted "T" in FIG. 5. In addition, as described below with respect to FIG. 5, the sides of the data line are preferably sloped such that coverage of a dielectric layer over the data line is improved. The data line can be formed by any number of conventional techniques, such as, for example, sputtering, where the data line comprises a metal. The width (dimension "W" in FIG. 4) of the data line will depend on the design, but is expected to be in the range of about 2 microns to about 10 microns or more.

After deposition of the dielectric layer over the data line, the scan line 38 and attached gate 40 are formed. The scan line and gate comprise a conductive material, for example, a metal. Examples of metals that could be used for the scan line and gate include molybdenum, chromium, aluminum, silver, copper, gold and titanium. The scan line and gate are formed in the same process steps, for example, by sputtering, and have widths similar to the data line. The scan line and gate have a thickness range of about 0.1 microns to about 1 micron.

Figure 5:
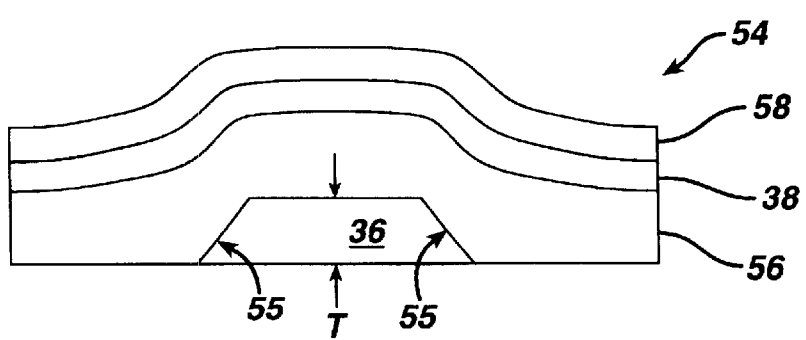
FIG. 5 is a cross-sectional view of the crossover area of the addressing and data lines of the pixel of FIG. 4.

FIG. 5 is a cross-sectional view of a crossover section 54 of the address and data lines taken along lines 5—5 of FIG. 4. As noted above, the sides 55 of data line 36 are preferably sloped. As illustrated, the sidewalls 55 are shown here at an exemplary 45° angle; "sloped" as used herein refers to a non-vertical disposition of the portion of data line 36 extending between its top surface and the substrate 34, preferably in a range between about 20° and about 80°. The sloped sidewall improves step coverage of a passivation layer 56 over the data line. Examples of the type of passivation material that could be used include $SiN_x$, where "X" is approximately 1.3±0.2, and $SiO_2$. Sloping of the sides of the data line is accomplished by, for example, metal dry etching. The passivation layer preferably has a thickness, on the order of about 0.75 microns to about 1.0 microns, but can also be in the range of about 0.1 microns to about 3 microns, and covers the entire area of the substrate for the array. The passivation layer described above in combination with the data line disposed directly on the substrate reduces the chances of the data line having open-circuit defects due to particles, underlay film defects, problems of step coverage and etch undercut, and other possible causes. At the crossover of the data and scan lines is another dielectric layer 58 comprising, for example, $SiN_x$ or a combination of $SiO_2$ and $SiN_x$, and having a thickness of about 0.2 to about 2 microns (about 1 micron is preferred).

Returning now to FIG. 4, island 42 is formed over gate 40 (as used herein, "over", "above," "below" and the like refer to relative placement of components as illustrated in the Figures and do not imply operational limitations on orientation of the device). The semiconductor island comprises substantially intrinsic silicon doped (e.g., by chemical vapor deposition) to have an N+ conductivity type in the areas over which the source and drain of TFT 39 will be formed. A blanket layer of substantially intrinsic silicon is etched by, for example, reactive ion etching, to leave intrinsic silicon extending over the gate and in the crossover area. One example of a dopant that could be used is phosphorous. The thickness of the intrinsic silicon is between about 500 Å and about 5000 Å or more.

Figure 6:
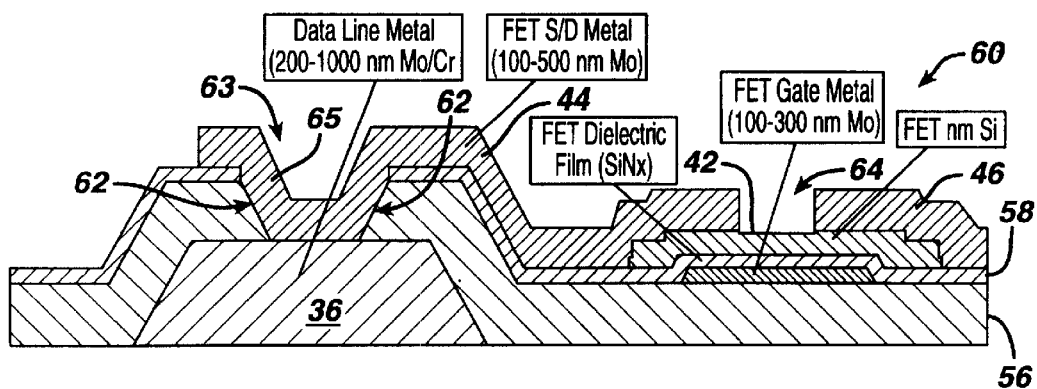
FIG. 6 is a cross-sectional view of the switching device portion of the pixel of FIG. 4.

Over the island 42, the source 44 and drain 46 (with connected bottom electrode 48, not shown) are formed. The source, drain and bottom electrode comprise a conductive material, for example, metal. Examples of metals that can be used include molybdenum, chromium and titanium. FIG. 6 is a cross-sectional view taken along lines 6—6 of the switching device section 60 of the imaging array portion 32 of FIG. 4. The source and drain have a thickness of between about 0.1 microns and about 0.5 microns. The source, drain and electrode can be patterned using conventional masking techniques with photoresist.

Also shown in FIG. 6 are the preferably sloped sidewalls 62 of a via 63 from a digdown process to electrically couple the source/drain electrodes to data line 36. Sloping of the via sidewalls provides acceptable step coverage for source 44, that is, provides high integrity (e.g. electrically defect-free) coverage by an overlying layer. To achieve the sloped sidewalls, passivation layer 56 preferably comprises a low etch rate $SiN_x$, compared to the etch rate for dielectric layer 58. This will allow for sloping with a controlled angle during a wet etch process using, for example, hydrofluoric acid. Note as well in FIG. 6 a gap 64 between the source and drain. Preferably, this gap is between about 1 micron and about 5 microns wide. The conductive material 65 of source 44 also serves to electrically couple the data line 36 to switching device 39.

Figure 7:
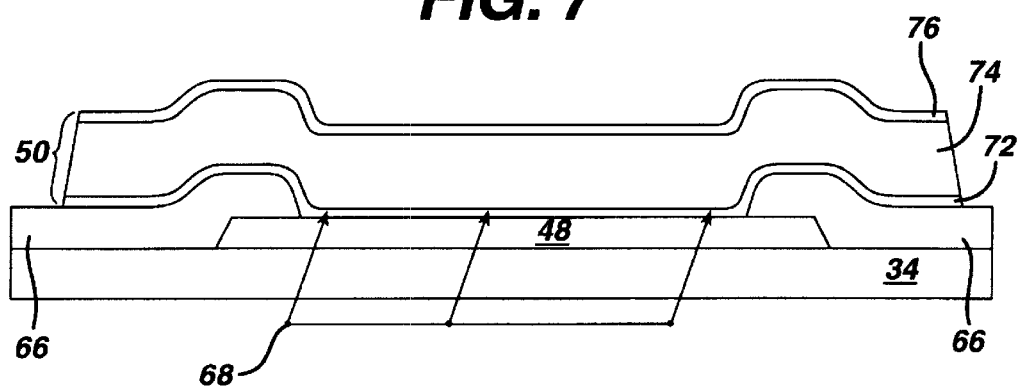
FIG. 7 is cross-sectional view of the photodiode shown in FIG. 4.

One amorphous silicon based example of how to fabricate the light-sensitive imaging device 50 will now be provided with reference to FIG. 7. In this example, the light-sensitive imaging device 50 takes the form of a photodiode. An oxide layer 66, such as, for example, $SiO_2$, $SiN_x$, where "X" is approximately 1.3±0.2, or a combination thereof, is deposited to protect the TFT device 39 during subsequent formation of island 42 by, for example, reactive ion etching. A via 68 is etched in the oxide layer over the bottom electrode 48 using a wet etch technique, such as, for example, one involving hydrofluoric acid. Layers of a N+ amorphous silicon 72 (about 200 Å to about 2000 Å thick), substantially intrinsic amorphous silicon 74 (about 0.5 microns to about 5 microns thick), and P+ amorphous silicon 76 (about 100 Å to about 2000 Å thick), comprising the thin-film materials, are deposited by plasma enhanced chemical vapor deposition. The N type dopant typically comprises, for example, phosphorous, and the P type dopant could comprise, for example, Boron. The diode 50 is then delineated by conventional photolithographic techniques with photoresist and reactive ion etching.

Figure 8:
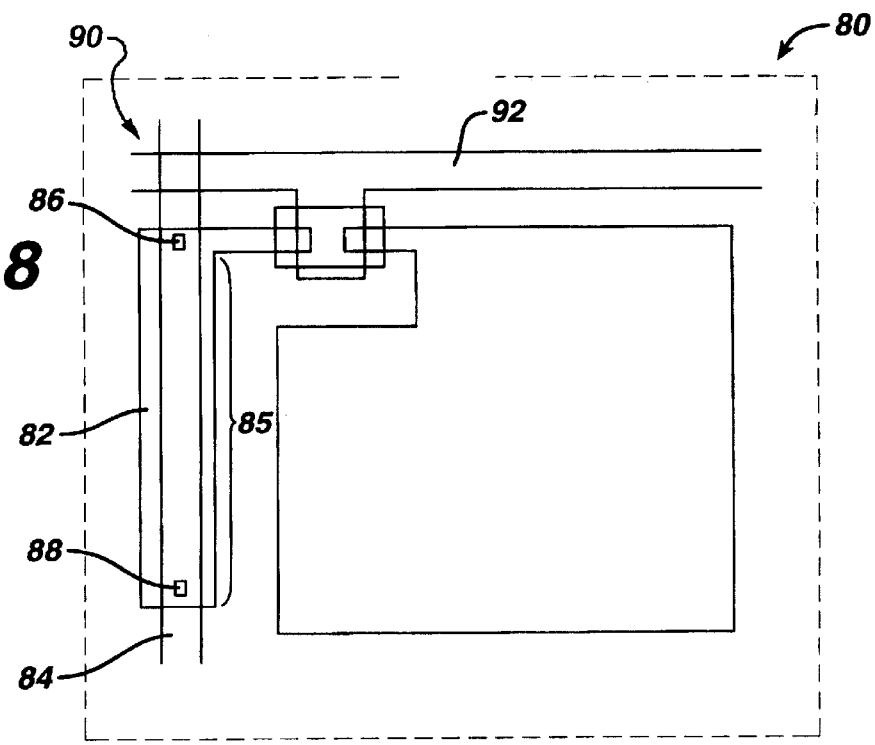
FIGS. 8 and 9 are plan views of portions of two other exemplary imaging arrays in accordance with the present invention.

FIG. 8 is a plan view of a portion 80 of another exemplary silicon-based imaging array in accordance with the present invention. Portion 80 is similar to portion 32 from FIG. 4, except that source 82 has a leg segment 85 that extends along the axis of data line 84, and electrically contacts data line 84 through multiple vias (here, vias 86 and 88). As in FIG. 4, source 82 and data line 84 are separated by one or more dielectric layers (note shown). In this embodiment, leg segment 85 of source 82 is disposed so as to not underline area 90 where data line 84 and scan line 92 cross over in order to minimize crossover capacitance.

Figure 9:
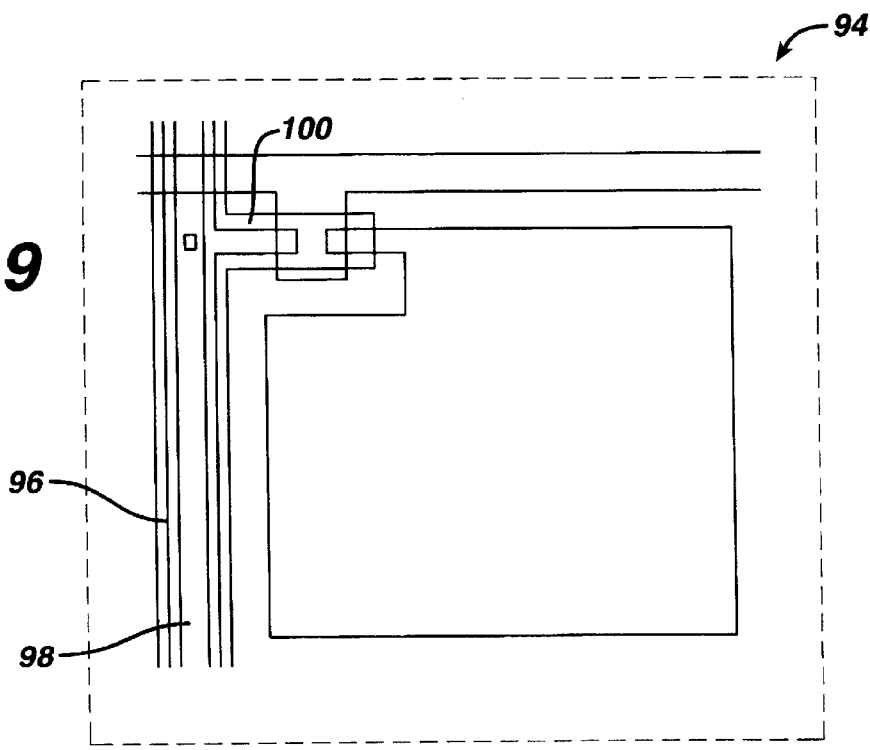

FIG. 9 is a plan view of a portion 94 of still another exemplary silicon-based imaging array in accordance with the present invention. The portion 94 structure is appropriate for use when crossover capacitance between scan and data lines is not of concern from the point of view of noise performance. Portion 94 is similar to portion 80 of FIG. 4, except that source extension 96 is strapped (that is, is disposed along the full length of the data line) with data line 98, and semiconductor island 100 is extended therebetween for electrical insulation.

While several embodiments of the present invention have been described and depicted herein, alternative embodiments may occur to those skilled in the art. Accordingly, it is intended by the appended claims to cover all such alternative embodiments that fall within the true spirit and scope of the invention.

What is claimed is:
1. An imager, including:
   a substrate;
   an array of photodiodes disposed over the substrate;
   at least one data line disposed directly on the substrate;
   a plurality of switching devices coupled between the at least one data line and the array of photodiodes, the plurality of switching devices comprising a field-effect transistor, the field-effect transistor comprising a gate, a source, and a drain, the source for the field-effect transistor being extended over the at least one data line;
   a semiconductor island coupled between the gate of the field-effect transistor, the source, and the drain of the field-effect transistor, the semiconductor island extending between the source and the at least one data line; and an at least one scan line coupled to the gate.

2. The imager of claim 1, wherein the at least one data line has a thickness of about 1 micron.

3. The imager of claim 1, wherein the field-effect transistor is a thin-film transistor.

4. The imager of claim 1, wherein the semiconductor island comprises substantially intrinsic silicon.

5. The imager of claim 1, wherein the semiconductor island comprises N+ doped silicon.

6. The imager of claim 1, wherein the at least one data line comprises sloped sides.

7. The imager of claim 1, further comprising:

an insulation layer situated between the at least one data line and the gate; and a conductive material electrically coupled to the at least one data line and the source through vias in the insulation layer.

8. The imager of claim 1, wherein the source for the field-effect transistor is extended over the at least one data line except for areas where the at least one data line and the at least one scan line overlap.

9. A method of forming an imager, including:

providing a substrate;

forming at least one data line disposed directly on the substrate;

forming an array of photodiodes disposed over the substrate;

forming a plurality of switching devices coupled between the at least one data line and the array of photodiodes, the plurality of switching devices further comprising a field-effect transistor comprising a gate, a source, and a drain;

forming an at least one scan line disposed over the substrate;

extending the source over the at least one data line;

forming a semiconductor island;

coupling the semiconductor island between the gate, the source, and the drain;

extending the semiconductor island between the source and the at least one data line; and coupling the at least one scan line to the gate.

10. The method of claim 9, wherein forming the at least one data line comprises forming the at least one data line to have a thickness of about 1 micron.

11. The method of claim 9, wherein the field-effect transistor is a thin-film transistor.

12. The method of claim 9, wherein forming the semiconductor island comprises:

forming a layer of substantially intrinsic silicon disposed over the substrate; and doping the layer of substantially intrinsic silicon.

13. The method of claim 12, wherein doping the layer of substantially intrinsic silicon comprises doping to be N+ conductivity type.

14. The method of claim 9, wherein forming the at least one data line comprises forming the at least one data line with sloped sides.

15. The method of claim 9, further comprising:

extending the source over the at least one data line except for areas where the at least one data line and the at least one scan line overlap.

16. The method of claim 9, further comprising:

disposing an insulation layer between the at least one data line and the gate; and electrically coupling a conductive material to the at least one data line and the source through vias in the insulation layer.

* * * * *